United States Patent
Park

(10) Patent No.: US 9,841,648 B2
(45) Date of Patent: Dec. 12, 2017

(54) METHOD FOR MANUFACTURING GLASS SUBSTRATE, GLASS SUBSTRATE, AND PANEL FOR DISPLAY

(71) Applicant: AvanStrate Inc., Tokyo (JP)

(72) Inventor: Young Tae Park, Kyoto (JP)

(73) Assignee: AvanStrate Inc., Tokyo (JP)

( * ) Notice: Subject to any disclaimer, the term of this patent is extended or adjusted under 35 U.S.C. 154(b) by 0 days.

(21) Appl. No.: 14/907,848

(22) PCT Filed: Jul. 23, 2014

(86) PCT No.: PCT/JP2014/069436
§ 371 (c)(1),
(2) Date: Jan. 27, 2016

(87) PCT Pub. No.: WO2015/012307
PCT Pub. Date: Jan. 29, 2015

(65) Prior Publication Data
US 2017/0023834 A1   Jan. 26, 2017

(30) Foreign Application Priority Data

Jul. 24, 2013 (JP) ................... 2013-153851

(51) Int. Cl.
*H01L 29/10* (2006.01)
*G02F 1/1362* (2006.01)
(Continued)

(52) U.S. Cl.
CPC ........ *G02F 1/136204* (2013.01); *C03C 15/00* (2013.01); *H01L 27/124* (2013.01);
(Continued)

(58) Field of Classification Search
CPC ............. H01L 27/1218; H01L 27/1222; H01L 27/1225; H01L 27/124; H01L 27/1262; G02F 1/136204; C03C 15/00
(Continued)

(56) References Cited

U.S. PATENT DOCUMENTS

2002/0151426 A1* 10/2002 Murata .................. C03C 3/091
501/66
2004/0192171 A1* 9/2004 Koike .................. B24B 37/042
451/5
(Continued)

FOREIGN PATENT DOCUMENTS

JP      2001-206734 A    7/2001
JP      2005-255478 A    9/2005
(Continued)

OTHER PUBLICATIONS

International Preliminary Report on Patentability issued from the International Bureau in counterpart International Application No. PCT/JP2014/069436, dated Feb. 4, 2016.
(Continued)

*Primary Examiner* — Dzung Tran
(74) *Attorney, Agent, or Firm* — Sughrue Mion, PLLC

(57) ABSTRACT

A method for manufacturing a glass substrate comprises a surface processing step of performing surface processing for forming unevenness on a glass surface. In the surface processing step, protruded portions having a height of 1nm or more from an average line of a roughness curve are dispersedly formed on the glass surface. In the surface processing step, the surface processing is performed such that a protruded portion area ratio is 0.5 to 10%. The protruded portion area ratio is a ratio of an area of the protruded portions with respect to an area of any rectangular region. The rectangular region has a square shape with a side length of 1 μm. In the surface processing step, in a case (Continued)

where the rectangular region is equally divided into at least one hundred divided regions having a square shape, the surface processing is performed such that a protruded portion content ratio is 80% or more. The protruded portion content ratio is a ratio of the number of divided regions having the protruded portions with respect to the number of divided regions included in the rectangular region.

7 Claims, 11 Drawing Sheets

(51) Int. Cl.
    *C03C 15/00*     (2006.01)
    *H01L 27/12*     (2006.01)
    *H01L 29/423*     (2006.01)
    *H01L 29/786*     (2006.01)
    *G02F 1/1335*     (2006.01)
    *G02F 1/1341*     (2006.01)
    *G02F 1/1368*     (2006.01)
    *G02F 1/1333*     (2006.01)

(52) U.S. Cl.
    CPC ...... *H01L 27/1218* (2013.01); *H01L 27/1222* (2013.01); *H01L 27/1225* (2013.01); *H01L 27/1262* (2013.01); *H01L 29/42384* (2013.01); *H01L 29/7869* (2013.01); *H01L 29/78672* (2013.01); *G02F 1/1341* (2013.01); *G02F 1/1368* (2013.01); *G02F 1/133514* (2013.01); *G02F 1/136286* (2013.01); *G02F 2001/133302* (2013.01); *G02F 2202/16* (2013.01)

(58) Field of Classification Search
    USPC .............................................. 257/43; 438/63
    See application file for complete search history.

(56) References Cited

U.S. PATENT DOCUMENTS

| | | | | |
|---|---|---|---|---|
| 2007/0104954 | A1* | 5/2007 | Ito | C03C 23/006 428/410 |
| 2008/0076656 | A1* | 3/2008 | Suzuki | C03B 5/225 501/53 |
| 2010/0062608 | A1* | 3/2010 | Hopfe | H01L 21/31116 438/723 |
| 2012/0058306 | A1* | 3/2012 | Miwa | C03C 3/091 428/141 |

FOREIGN PATENT DOCUMENTS

| | | |
|---|---|---|
| JP | 2008-120638 A | 5/2008 |
| JP | 2010-275167 A | 12/2010 |
| JP | 2012-140292 A | 7/2012 |
| JP | 2012-171831 A | 9/2012 |
| WO | 2010/128673 A1 | 11/2010 |
| WO | 2011/092764 A1 | 8/2011 |

OTHER PUBLICATIONS

International Search Report of PCT/JP2014/069436 dated Oct. 28, 2014 [PCT/ISA/210].

* cited by examiner

METHOD FOR MANUFACTURING GLASS SUBSTRATE, GLASS SUBSTRATE, AND PANEL FOR DISPLAY

CROSS REFERENCE TO RELATED APPLICATIONS

This application is a National Stage of International Application No. PCT/JP2014/069436, filed Jul. 23, 2014, claiming priority based on Japanese Patent Application No. 2013-153851, filed Jul. 24, 2013, the contents of all of which are incorporated herein by reference in their entirety.

TECHNICAL FIELD

The present invention relates to a method for manufacturing a glass substrate, a glass substrate, and a panel for a display.

BACKGROUND ART

A glass substrate is used in manufacturing a flat panel display such as a liquid crystal display apparatus. In a process for manufacturing a flat panel display, the glass substrate is mounted on a susceptor in a reactor vessel of a semiconductor manufacturing apparatus and subjected to film forming processing in order to form a semiconductor element such as a thin film transistor (TFT) on the surface of the glass substrate. The film forming processing is performed multiple times using a plurality of semiconductor manufacturing apparatuses in order to form a plurality of types of thin films on the glass substrate. Each time the film forming processing is performed, the glass substrate is removed from the susceptor. At this time, static electricity due to friction, that is, peeling electrification occurs between the metal surface of the susceptor on which the glass substrate has been mounted and the surface of the glass substrate, and static electricity accumulates in the glass substrate. Accordingly, a large amount of static electricity accumulates in the glass substrate subjected to the film forming processing multiple times.

In particular, the surface of a glass substrate constituted by alkali-free glass to be used in a liquid crystal display apparatus is easily electrified, and it is difficult to eliminate static electricity. When peeling electrification repeatedly occurs, the glass substrate is likely to stick to the metal surface of the susceptor due to the static electricity. Accordingly, when the glass substrate is removed from the susceptor, excessive force is applied to the glass substrate, and thus the glass substrate is sometimes broken. Moreover, the semiconductor element formed on the surface of the glass substrate is sometimes broken due to voltage generated by the accumulating static electricity caused by the peeling electrification. Furthermore, fine foreign matter such as dust or dirt sometimes attaches to the surface of the glass substrate due to the static electricity accumulating in the glass substrate.

Under such circumstances, manufacturing a glass substrate whose surface is unlikely to be electrified in the process for manufacturing a flat panel display has been proposed. For example, a glass substrate disclosed in Patent Literature 1 (JP 2005-255478A) has a device surface that is a surface on which electrode wires and various devices are formed and a roughening surface on a side opposite to the device surface. The roughening surface is a surface roughened by forming unevenness thereon through physical polishing or chemical processing and has an arithmetic mean roughness Ra of 0.3 to 10 nm. The electrification of the glass substrate is suppressed by performing roughening processing on the roughening surface.

SUMMARY OF INVENTION

Technical Problem

The roughened surface of the glass substrate has minute recessions and protrusions. Moreover, the smaller the area of contact between the glass substrate and a table on which the glass substrate is mounted is, the more unlikely peeling electrification is to occur. Therefore, the larger the number of protruded portions of a glass substrate surface roughness curve is, the smaller the area of contact between the glass substrate and the table is, and thus the more effectively the electrification of the glass substrate is suppressed. However, there is no correlation between the Ra, which is one of the parameters indicating the roughening degree of the surface of the glass substrate, and the number of the protruded portions of the glass substrate surface roughness curve. Therefore, even when the surface of the glass substrate is roughened such that the Ra is in a predetermined range, there is a possibility that the electrification of the glass substrate is not sufficiently suppressed.

If the protruded portions are not dispersedly provided over the entire surface of the glass substrate, the surface of the glass substrate has regions where a large number of protruded portions are formed in a concentrated manner and regions where hardly any protruded portions are formed. The regions where hardly any protruded portions are formed are regions where the area of contact with the table is locally large, and thus are regions where the peeling electrification is likely to occur. Therefore, if the distribution of the protruded portions on the surface of the glass substrate is imbalanced, there is a possibility that the glass substrate has a region where electrification is not sufficiently suppressed. Accordingly, it is necessary that the protruded portions are dispersedly provided on the surface of the glass substrate in order to improve the quality of the glass substrate.

An object of the present invention is to provide a method for manufacturing a glass substrate with which the electrification of a surface is effectively suppressed.

Solution to Problem

A method for manufacturing a glass substrate according to an aspect of the present invention is a method for manufacturing a glass substrate for a display, and the method comprises: a manufacturing step of manufacturing a glass substrate; and a surface processing step of performing surface processing for forming unevenness on a glass surface that is one main surface of the glass substrate. In the surface processing step, protruded portions having a height of 1 nm or more from an average line of a roughness curve are dispersedly formed on the glass surface. In the surface processing step, the surface processing is performed such that a protruded portion area ratio is 0.5 to 10%. The protruded portion area ratio is a ratio of an area of the protruded portions with respect to an area of any rectangular region. The rectangular region has a square shape with a side length of 1 μm and occupies a portion of the glass surface. In the surface processing step, in a case where the rectangular region is equally divided into at least one hundred divided regions having a square shape, the surface processing is performed such that a protruded portion content ratio is 80% or more. The protruded portion content ratio is a ratio of the number of divided regions having the protruded portions with respect to the number of divided regions included in the rectangular region.

In this method for manufacturing a glass substrate, the protruded portion content ratio is an index indicating a degree of imbalance in the distribution of the protruded portions on the surface of the glass substrate. The larger the protruded portion content ratio is, the smaller the imbalance in the distribution of the protruded portions is, and the more uniformly the protruded portions are spread on the surface of the glass substrate. The smaller the protruded portion content ratio is, the larger the imbalance in the distribution of the protruded portions is, and the less uniformly the protruded portions are spread on the surface of the glass substrate. When the glass substrate is mounted on the table, the smaller the imbalance in the distribution of the protruded portions is, the more likely the area of the region where the surface of the glass substrate and the surface of the table are in contact with each other is to be small. Therefore, the electrification of the glass substrate is more suppressed. That is, in this method for manufacturing a glass substrate, the surface processing is performed on the glass substrate such that the protruded portion content ratio is 80% or more, thus making it possible to effectively suppress the electrification of the glass substrate.

It is preferable that the protruded portion area ratio is 0.75 to 7.0%.

It is preferable that the protruded portion content ratio is 90% or more.

It is preferable that the surface processing is chemical etching processing.

It is preferable that a main surface on a side opposite to the glass surface is a device surface on which a semiconductor element is to be formed.

It is preferable that the device surface is a surface on which a low-temperature polysilicon semiconductor or an oxide semiconductor is to be formed.

It is preferable that the glass substrate is constituted by boroaluminosilicate glass having a composition including Si, Al and B.

In a glass substrate according to an aspect of the present invention, protruded portions having a height of 1 nm or more from an average line of a roughness curve are dispersedly formed on a glass surface that is one main surface of the glass substrate. A protruded portion area ratio of the glass substrate is 0.5 to 10%. The protruded portion area ratio is a ratio of an area of the protruded portions with respect to an area of any rectangular region. The rectangular region has a square shape with a side length of 1 μm and occupies a portion of the glass surface. In a case where the rectangular region is equally divided into at least one hundred divided regions having a square shape, a protruded portion content ratio of the glass substrate is 80% or more. The protruded portion content ratio is a ratio of the number of divided regions having the protruded portions with respect to the number of divided regions included in the rectangular region. A main surface on a side opposite to the glass surface is a device surface on which a semiconductor element is to be formed.

It is preferable that the device surface is a surface on which a low-temperature polysilicon semiconductor or an oxide semiconductor is to be formed.

It is preferable that the glass substrate is constituted by boroaluminosilicate glass having a composition including Si, Al and B.

A panel for a display according to an aspect of the present invention is a glass substrate on which a semiconductor element is formed. The panel for a display comprises a first main surface and a second main surface. The first main surface is one main surface of the glass substrate on which protruded portions having a height of 1 nm or more from an average line of a roughness curve are dispersedly formed. The second main surface is a main surface on a side opposite to the first main surface on which a semiconductor element is to be formed. A protruded portion area ratio of the panel for a display is 0.5 to 10%. The protruded portion area ratio is a ratio of an area of the protruded portions with respect to an area of any rectangular region. The rectangular region has a square shape with a side length of 1 μm and occupies a portion of the glass surface. In a case where the rectangular region is equally divided into at least one hundred divided regions having a square shape, a protruded portion content ratio is 80% or more. The protruded portion content ratio is a ratio of the number of divided regions having the protruded portions with respect to the number of divided regions included in the rectangular region.

It is preferable that the panel for a display is a TFT panel having a circuit in which wiring has a minimum line width of less than 4 μm and a gate insulating film has a film thickness of less than 100 nm.

Advantageous Effects of the Invention

In a glass substrate manufactured with the method for manufacturing a glass substrate according to an aspect of the present invention, the electrification of the surface is effectively suppressed.

DESCRIPTION OF EMBODIMENTS (1) Outline of Method for Manufacturing Glass Substrate Embodiments of the present invention will be described with reference to the drawings. A glass substrate 10 manufactured with a glass substrate manufacturing method used in the present embodiment is to be used in manufacturing a flat panel display (FPD) such as a liquid crystal display, a plasma display, or an organic EL display. The glass substrate 10 is also to be used in manufacturing a solar cell panel. The glass substrate 10 has a thickness of 0.2 to 0.8 mm, and is 680 to 2200 mm wide and 880 to 2500 mm long, for example.

Figure 1:
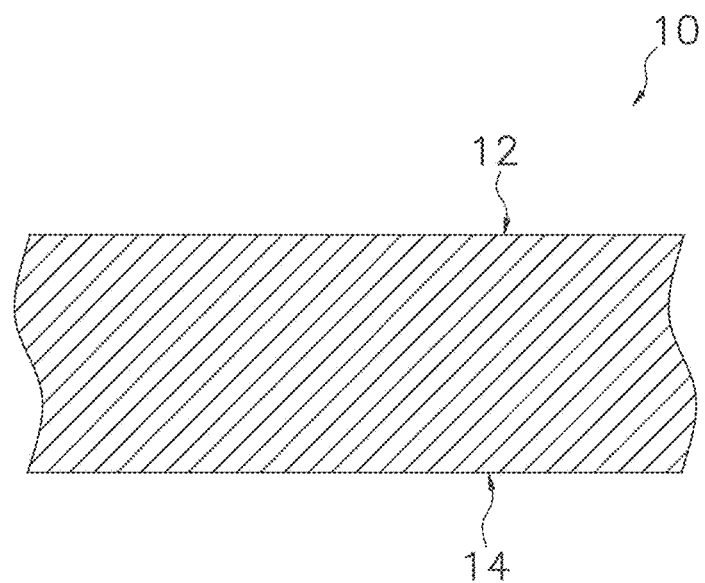
FIG. 1 is a cross-sectional view of a glass substrate according to an embodiment.

FIG. 1 is a cross-sectional view of the glass substrate 10. The glass substrate 10 has an element forming surface 12 that is one main surface, and a roughening surface 14 that is the other main surface. The element forming surface 12 is a surface on which a semiconductor element such as a TFT is formed in a process for manufacturing a FPD. The element forming surface 12 is a surface on which a low-temperature polysilicon semiconductor or an oxide semiconductor is formed, for example, and is a surface on which a multilayer thin film including a low-temperature polysilicon thin film, an indium thin oxide (ITO) thin film, a color filter and the like are formed. In TFT panels for a high-definition and high-resolution display, a gate insulating film of the TFT has a thickness of less than 100 nm. TFT panels in which a gate insulating film has a thickness of 5 to 20 nm, for example, have also been developed and manufactured. In such TFT panels, not only the gate insulating film but also the layers constituting a semiconductor element have a small film thickness. Therefore, the element forming surface 12 is a smooth surface having a Ra (arithmetic mean roughness: JIS B 0601:2001) of 1.5 nm or less, and preferably 1.0 nm or less. It is preferable that the glass substrate 10 with the element forming surface 12 on which a TFT is formed has a circuit in which wiring has a minimum line width of less than 4 μm and the gate insulating film has a film thickness of less than 100 nm.

The roughening surface 14 is a surface on which minute unevenness is formed through etching processing in the process for manufacturing the glass substrate 10 as described later. Examples of the etching processing comprise dry etching processing and wet etching processing. In the present embodiment, the unevenness on the roughening surface 14 is formed through immersion etching (dip etching) processing, which is one type of the wet etching processing. In the immersion etching processing, the entire glass substrate 10 is immersed in an etching liquid tank that stores an etching liquid. Accordingly, both the element forming surface 12 and the roughening surface 14 of the glass substrate 10 are roughened. When only the roughening surface 14 of the glass substrate 10 is roughened in the immersion etching processing, the glass substrate 10 in which a protective film is attached to the element forming surface 12 is immersed in the etching liquid tank.

The unevenness on the roughening surface 14 may be formed through a surface processing other than the etching processing as long as a desired surface state can be obtained. For example, the unevenness on the roughening surface 14 may also be formed through physical polishing such as tape polishing, brush polishing, pad polishing, abrasive polishing, or chemical mechanical polishing (CMP).

One example of the glass composition of the glass substrate 10 is as follows.

The glass composition comprises
(a) $SiO_2$: 50 to 70 mass %,
(b) $Al_2O_3$: 10 to 25 mass %,
(c) $B_2O_3$: 5 to 18 mass %,
(d) MgO: 0 to 10 mass %,
(e) CaO: 0 to 20 mass %,
(f) SrO: 0 to 20 mass %,
(g) BaO: 0 to 10 mass %,
(h) RO: 5 to 20 mass % (R is at least one selected from Mg, Ca, Sr and Ba),
(i) $R'_2O$: 0 to 2.0 mass % (R' is at least one selected from Li, Na and K), and
(j) at least one metal oxide selected from $SnO_2$, $Fe_2O_3$ and $CeO_2$.

It is allowed that glass having the above-mentioned composition may contain other minor components in a range of less than 0.1 mass %.

Figure 2:
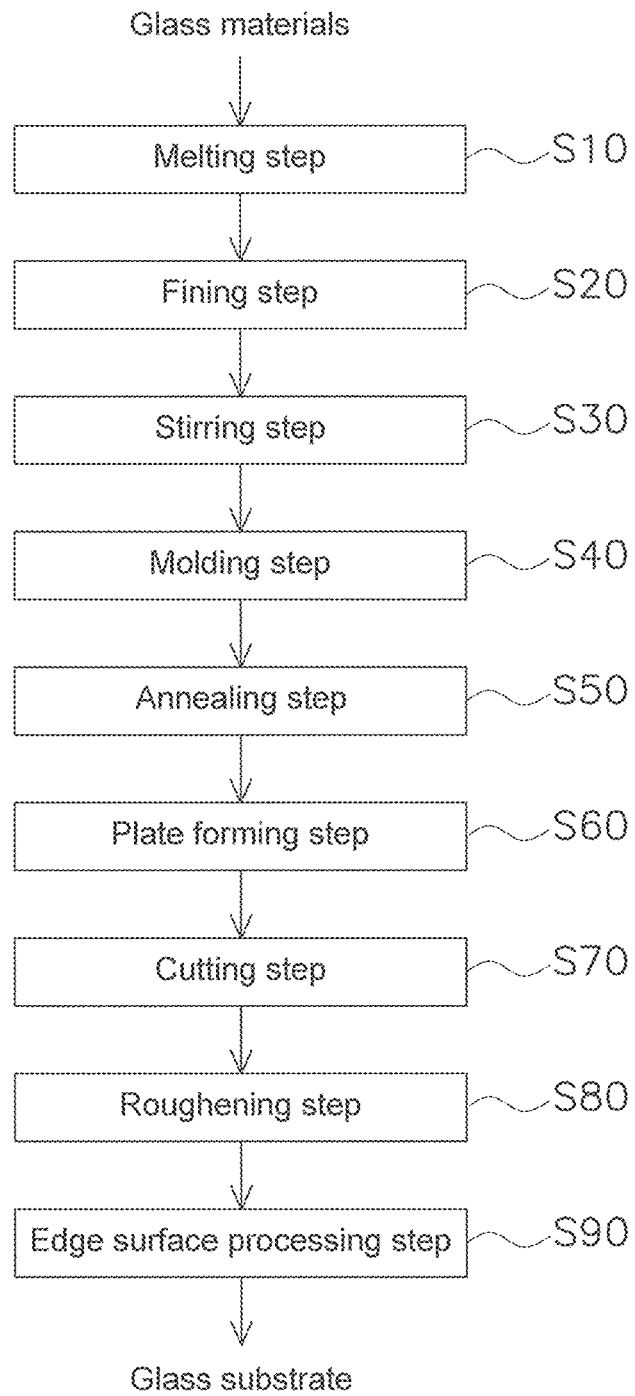
FIG. 2 is a flowchart illustrating a method for manufacturing a glass substrate according to an embodiment.

The glass substrate 10 is molded with a float method, a down draw method, or the like. In the present embodiment, a process for manufacturing the glass substrate 10 for a FPD using an overflow down draw method will be described. FIG. 2 is an example of a flowchart illustrating a process for manufacturing the glass substrate 10. The process for manufacturing the glass substrate 10 mainly comprises a melting step (step S10), a fining step (step S20), a stirring step (step S30), a molding step (step S40), an annealing step (step S50), a plate forming step (step S60), a cutting step (step S70), a roughening step (step S80), and an edge surface processing step (step S90). The melting step S10, the fining step S20, the stirring step S30, the molding step S40, the annealing step S50, the plate forming step S60, and the cutting step S70 serve as a substrate manufacturing process in which the glass substrate 10 is manufactured from glass materials. The roughening step S80 serves as a surface processing process in which the roughening surface 14 of the glass substrate 10 is roughened through the etching processing. Next, examples of outlines of the steps is described.

In the melting step S10, the glass materials are melted in a melting tank using a heating means such as a burner, and molten glass at a high temperature of 1500 to 1600° C. is produced. The glass materials are prepared such that glass having a desired composition can be substantially obtained. Here, "substantially" means that other minor components are allowed to exist in a range of less than 0.1 mass %. The molten glass is sent to a downstream step through an outlet provided in the bottom portion of the melting tank.

In the fining step S20, the molten glass, which was produced in the melting step S10, is fined in a fining tank by further raising the temperature of the molten glass. In the fining tank, the temperature of the molten glass is protruded to 1600 to 1750° C., and preferably 1650 to 1700° C. In the fining tank, small bubbles of $O_2$, $CO_2$ and $SO_2$ contained in the molten glass absorb $O_2$ produced by reduction of a fining agent such as $SnO_2$ contained in the glass materials and become large, and then float up to the liquid surface of the molten glass.

In the stirring step S30, the molten glass, which was fined in the fining step S20, is stirred in a stirring tank, and is homogenized chemically and thermally. In the stirring tank, the molten glass is stirred with a pivoting stirrer while flowing in a vertical direction, and is sent to a downstream step through an outlet provided in a bottom portion of the stirring tank. Moreover, in the stirring step S30, glass components, such as zirconia-rich molten glass, having a specific gravity that is different from an average specific gravity of molten glass are removed from the stirring tank.

In the molding step S40, the molten glass, which was stirred in the stirring step S30, is molded into a glass ribbon with an overflow down draw method. Specifically, the molten glass, which overflows from the top portion of a molding cell and is divided into streams, flows downward along lateral walls of the molding cell, merges at the lower end of the molding cell, and thus is continuously molded into a glass ribbon. The molten glass is cooled to a temperature suitable for molding with the overflow down draw method, e.g., 1200° C., before flowing to the molding step S40.

In the annealing step S50, the glass ribbon, which was continuously produced in the molding step S40, is annealed to a temperature that is lower than or equal to the annealing point while the temperature is controlled such that strain and warping do not occur.

In the plate forming step S60, the glass ribbon, which was annealed in the annealing step S50, is cut by a predetermined length.

In the cutting step S70, the glass ribbon, which was cut by a predetermined length in the plate forming step S60, is cut into a predetermined size, and the glass substrate 10 is obtained.

As described later, in the roughening step S80, surface processing for increasing the surface roughness of the roughening surface 14 of the glass substrate 10 obtained in the cutting step S70 is performed.

In the edge surface processing step S90, the edge portions of the glass substrate 10 whose roughening surface 14 was subjected to the surface processing in the roughening step S80 are polished and ground.

Processes for cleaning and inspecting the glass substrate 10 are performed after the edge surface processing step S90. Finally, the glass substrates 10 are packed and shipped to a FPD manufacturer. The FPD manufacturer forms a semiconductor element such as a TFT on an element forming surface 12a of the glass substrate 10 and manufactures a FPD.

(2) Details of Roughening Step

Figure 3:
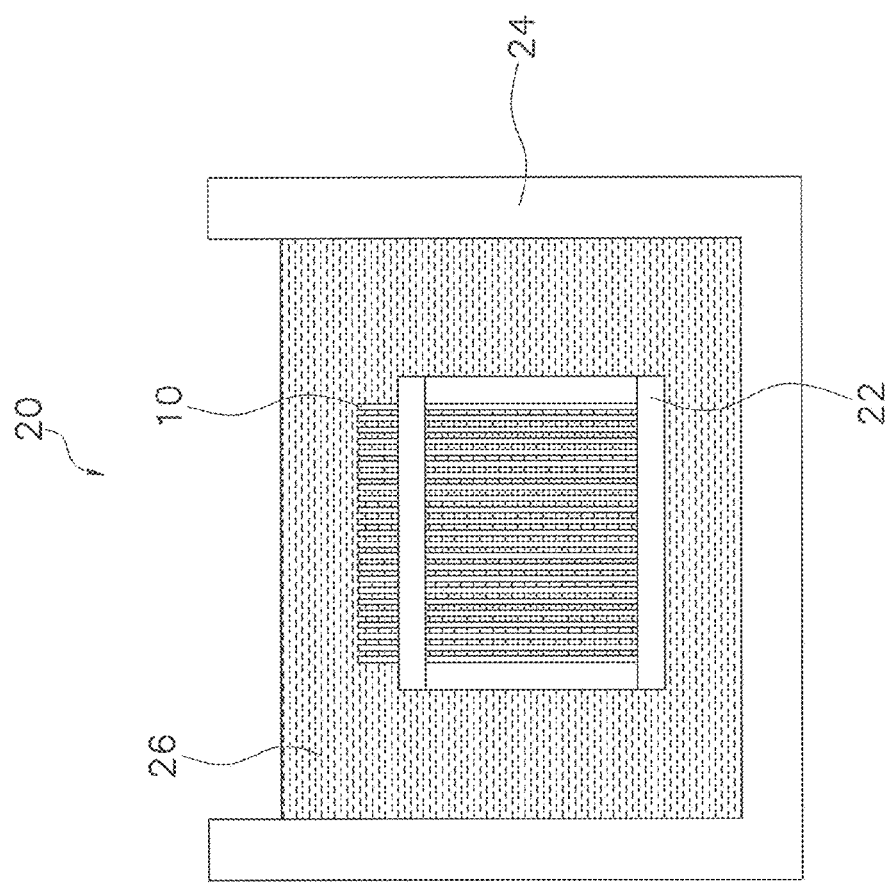
FIG. 3 is a schematic view of an immersion etching apparatus.

The surface processing performed on the roughening surface 14 in the roughening step S80 will be described. FIG. 3 is a schematic view of an immersion etching apparatus 20 for performing immersion etching processing on the glass substrate 10. The immersion etching apparatus 20 comprises a cassette 22 that can accommodate a plurality of glass substrates 10, a conveying mechanism (not shown) that conveys the cassette 22, and an etching liquid tank 24. The etching liquid tank 24 is equipped with an ultrasonic mechanism and a temperature adjusting mechanism as needed. The ultrasonic mechanism cleans the glass substrates 10 with ultrasonic waves and promotes etching processing performed on the surfaces of the glass substrates 10 in a state in which the glass substrates 10 are immersed in an etching liquid 26. The temperature adjusting mechanism adjusts the temperature of the etching liquid 26. The immersion etching apparatus 20 further comprises a tank (not shown) that supplies the etching liquid 26 to the etching liquid tank 24.

The cassette 22 accommodating the glass substrates 10 is conveyed by the conveying mechanism and immersed in the etching liquid 26 stored in the etching liquid tank 24. After being immersed in the etching liquid 26, the glass substrates 10 are successively immersed in liquids such as pure water, ultrapure water and functional water, and are cleaned. The etching liquid 26 is a hydrogen fluoride (HF) solution, for example. The pure water and ultrapure water has been subjected to ion exchange processing, electrodeionization (EDI) processing, filtering processing using a reverse osmosis membrane, and decarbonation processing in which water is passed through a decarbonation apparatus. The functional water is ammonia hydrogen water, for example.

In the present embodiment, the concentration of the hydrogen fluoride (HF) solution used as the etching liquid 26 is 200 ppm to 1500 ppm, for example, and the temperature of the etching liquid 26 is maintained in a range of 20° C. to 30° C., for example. The glass substrates 10 are immersed in the etching liquid 26 for 60 seconds to 180 seconds, and preferably 100 seconds to 120 seconds.

(3) Details of Roughening Surface

The roughening surface 14, which was subjected to the surface processing in the roughening step S80, will be described. The roughening surface 14 is a surface on which minute unevenness is formed through an etching process in the roughening step S80.

The roughening surface 14 is a surface on which protruded portions are dispersedly formed. The protruded portions are portions having a height of 1 nm or more from the average line of the surface roughness curve of the roughening surface 14. In the roughening step S80, the surface processing is performed such that the roughening surface 14 has a protruded portion area ratio is 0.5 to 10%. The protruded portion area ratio is a ratio of the area of the protruded portions with respect to the area of any rectangular region. The rectangular region is a region that has a square shape with a side length of 1 μm and occupies a portion of the roughening surface 14. That is, any 1 μm by 1 μm square region included in the roughening surface 14 has the protruded portions.

Figure 4:
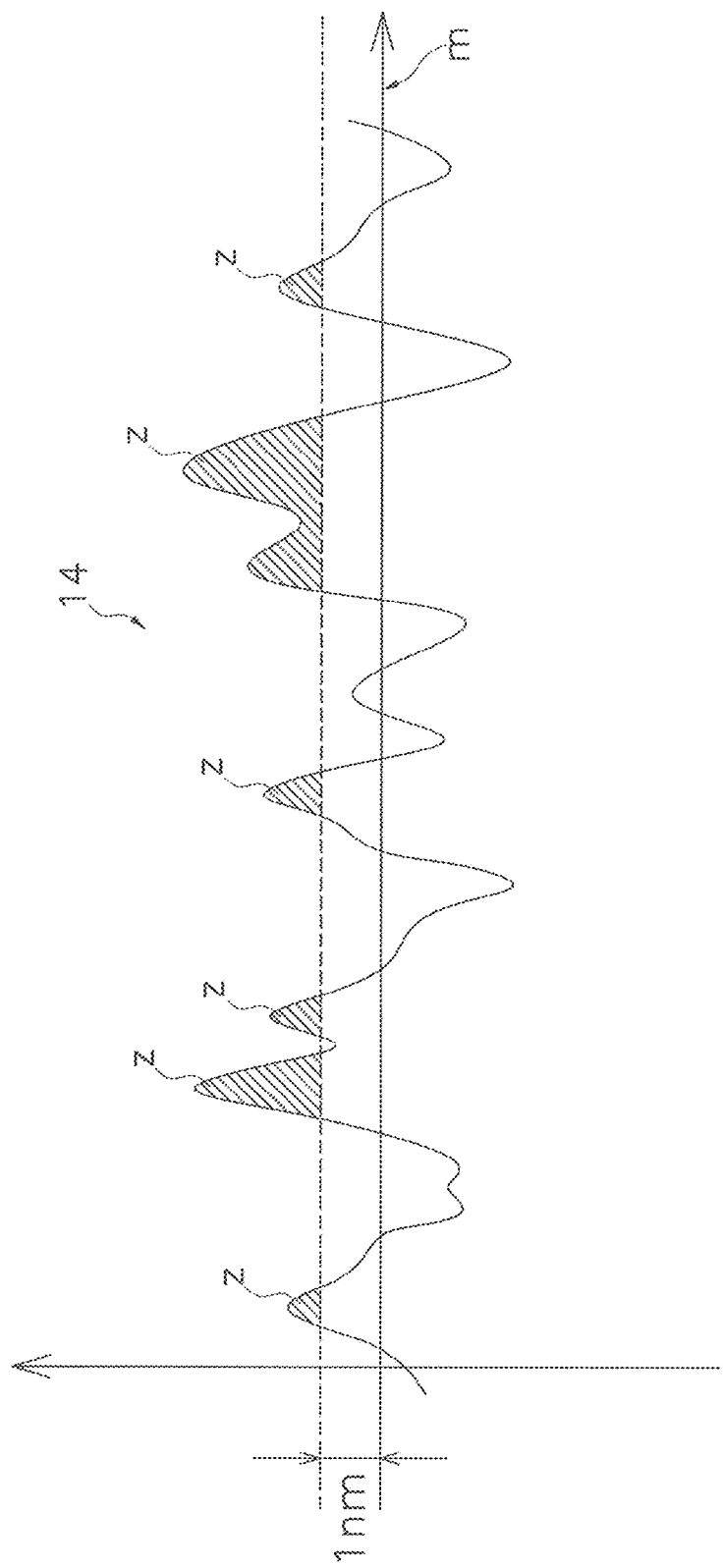
FIG. 4 is a diagram showing protruded portions formed on a roughening surface of the glass substrate.

FIG. 4 is a diagram showing the protruded portions formed on the roughening surface 14. FIG. 4 one-dimensionally shows the shape of a surface profile of the roughening surface 14. In FIG. 4, the average line of the roughness curve of the roughening surface 14 is shown as an average reference line m. In FIG. 4, the protruded portions having a height of 1 nm or more from the average reference line m are shown as hatched regions z. The height from the average reference line m at a certain point is a positive value in a case where the point is located above the average reference line m, and is a negative value in a case where the point is located below the average reference line m. The average reference line m is located at a height at which the sum of the heights with reference to the average reference line m at the points of the shape of the surface profile becomes zero.

Next, a method for measuring the protruded portion area ratio is described. The unevenness on the roughening surface 14 of the glass substrate 10 is measured using an atomic force microscope in a non-contact mode, for example. In the measurement of the roughening surface 14, measurement conditions of the atomic force microscope are adjusted such that a surface having a small surface roughness, e.g., an arithmetic mean roughness Ra of less than 1 nm, can be measured. For example, the measurement is performed under the conditions that the scan area is 1 μm square, the scan rate is 0.8 Hz, the servo gain is 1.5, the sampling is 256 points×256 points, and the set points are automatically set.

Figure 5:
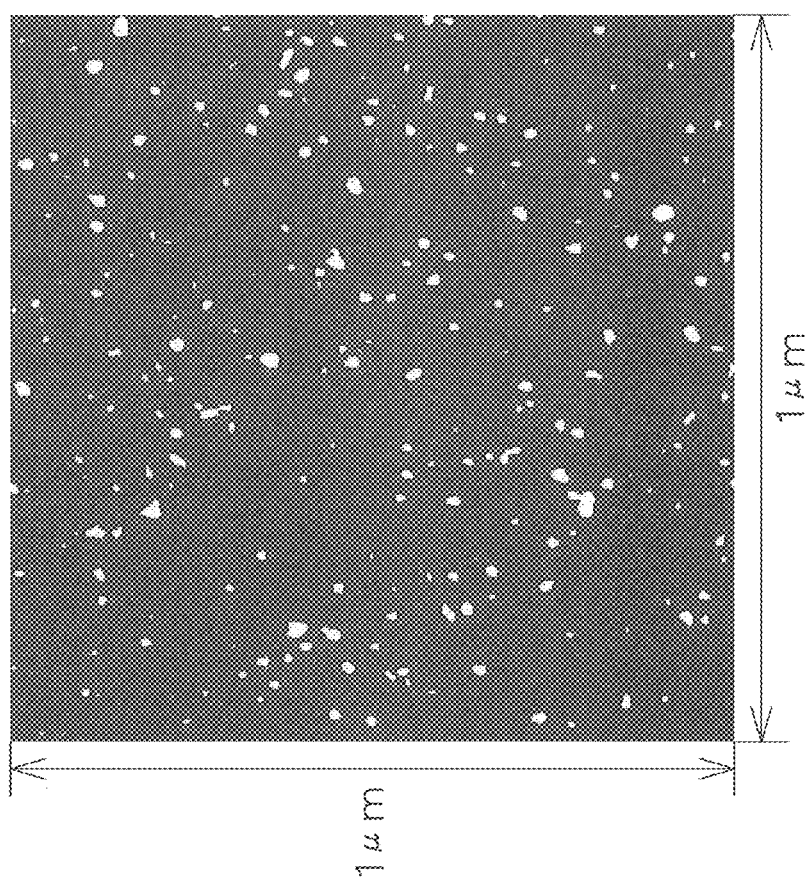
FIG. 5 is a diagram showing an example of the distribution of the protruded portions formed on the roughening surface.

FIG. 5 is a diagram showing an example of the distribution of the protruded portions formed in a 1 μm×1 μm (256 points×256 points) square region included in the roughening surface 14, measured using an atomic force microscope. In FIG. 5, the protruded portions having a height of 1 nm or more from the average reference line m are shown as white regions. The area of the protruded portions is determined by counting the number of pixels having a height of 1 nm or more from the average reference line m in an image that two-dimensionally shows the shape of the surface profile of the roughening surface 14, for example.

The protruded portion area ratio, which is an area ratio of the protruded portions shown as the white regions in FIG. 5 with respect to a 1 μm×1 μm square region, is in a range of 0.5 to 10%. The reason why the protruded portion area ratio is set to be 0.5 to 10% is as follows. It is said that charges are likely to be transferred between objects when the distance between the objects is less than 0.8 nm. Therefore, when the distance between the glass substrate 10 and a support such as a table on which the glass substrate 10 is mounted is 1 nm or less, there is a case where charges are transferred from the support to the glass substrate 10, and thus the glass substrate 10 is electrified.

In the present embodiment, the electrification of the glass substrate 10 is suppressed by performing the surface processing on the roughening surface 14 such that the protruded portion area ratio is 0.5% or more and by maintaining a sufficient distance between the glass substrate 10 and the table. When the protruded portion area ratio is less than 0.5%, portions around the protruded portions formed on the roughening surface 14 are likely to come into contact with the surface of the table, and therefore, the protruded portions cannot sufficiently support the glass substrate 10. Accordingly, it is not possible to maintain a sufficient distance between the glass substrate 10 and the surface of the table, and thus the glass substrate 10 is electrified. On the other hand, when the protruded portion area ratio is more than 10%, the number of contact points where the protruded portions formed on the roughening surface 14 are in contact with the surface of the table increases, and charges are likely to be transferred between the roughening surface 14 and the surface of the table. Therefore, the electrification amount of the glass substrate 10 increases. Moreover, when the etching processing is performed such that the protruded portion area ratio is more than 10%, it is difficult to form the target amount of minute unevenness on the roughening surface 14. Therefore, the quality of the surface of the glass substrate 10 cannot be sufficiently ensured, and defects such as scratches are likely to occur in the roughening surface 14. For example, there is a risk that potential minute scratches formed on the roughening surface 14 are enlarged through the surface processing. Accordingly, after being subjected to the etching processing, the protruded portion area ratio of the roughening surface 14 is 0.5% to 10%, preferably 0.75% to 7.0%, and more preferably 1.2% to 4.0%.

The surface processing through which the Ra of the roughening surface 14 is set to 0.3 nm to 1.5 nm is conventionally performed in order to suppress the electrification of the glass substrate 10. However, even when the Ra of the roughening surface 14 is 0.3 nm to 1.5 nm, the protruded portion area ratio of the roughening surface 14 is not necessarily 0.5% to 10%. Conversely, even when the protruded portion area ratio of the roughening surface 14 is 0.5% to 10%, the Ra of the roughening surface 14 is not necessarily 0.3 nm to 1.5 nm. That is, the Ra and the protruded portion area ratio are parameters that are independent of each other.

Accordingly, the Ra of the roughening surface 14 does not sufficiently serve as an index for indicating an effect of suppressing the electrification of the glass substrate 10. In the present embodiment, in consideration of this, the surface processing is performed on the roughening surface 14 such that the roughening surface 14 has a protruded portion area ratio of 0.5% to 10%.

Furthermore, in the present embodiment, the surface processing is performed on the roughening surface 14 such that the protruded portion content ratio is 80% or more. When the rectangular region is equally divided into at least one hundred divided regions having a square shape, the protruded portion content ratio is a ratio of the number of divided regions having the protruded portion with respect to the number of the divided regions included in the rectangular region.

Figure 6:
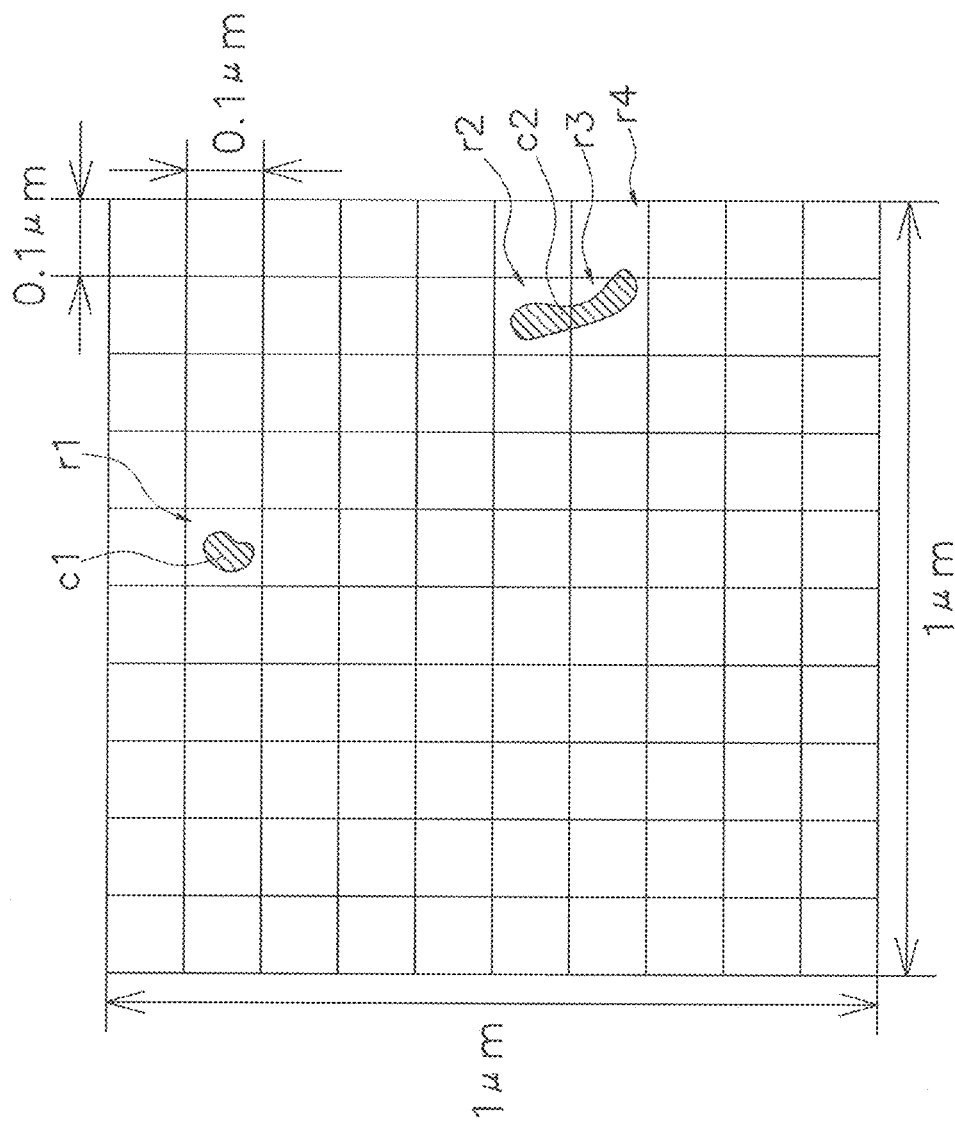
FIG. 6 is a diagram showing divided regions included in a rectangular region on the roughening surface.

FIG. 6 is a diagram showing the divided regions included in the rectangular region of the roughening surface 14. The rectangular region shown in FIG. 6 is a 1 μm×1 μm square region. The divided regions are regions obtained by dividing the rectangular region having a square shape into ten equal portions in the lateral direction and ten equal portions in the vertical direction. In FIG. 6, lines dividing the rectangular region, that is, border lines between the adjacent divided regions, are indicated by solid lines. Each divided region is a 0.1 μm×0.1 μm square region. The 1 μm square rectangular region has one hundred 0.1 μm square divided regions.

The protruded portion content ratio is a ratio of the number of the divided regions having the protruded portion with respect to the number of the divided regions included in the rectangular region. In FIG. 6, the number of the divided regions included in the rectangular region is one hundred. The divided region having the protruded portion is the divided region including the protruded portion or the divided region including a part of the protruded portion. FIG. 6 shows examples of the protruded portions as hatched regions. In FIG. 6, a protruded portion c1 is entirely included in a divided region r1, and a protruded portion c2 is included in three divided regions r2, r3 and r4. In this case, all of the divided regions r1, r2, r3 and r4 are divided regions having protruded portions. When the number of the divided regions included in the rectangular region is one hundred, the value of the protruded portion content ratio is equal to the number of the divided regions having the protruded portion. That is, when the protruded portion content ratio is 80% or more, the number of the divided regions having a protruded portion is 80 or more.

The protruded portion content ratio is an index indicating the degree of imbalance in the distribution of the protruded portions formed on the roughening surface 14. The larger the protruded portion content ratio is, the smaller the imbalance in the distribution of the protruded portions is, and the more uniformly the protruded portions are spread over the entire roughening surface 14. The smaller the protruded portion content ratio is, the larger the imbalance in the distribution of the protruded portions is, and the less uniformly the protruded portions are spread over the entire roughening surface 14. The smaller the imbalance in the distribution of the protruded portions is, the more likely it is that the area of the region where the surface of the table on which the glass substrate 10 is mounted is in contact with the roughening surface 14 of the glass substrate 10 will be small. Therefore, the electrification of the glass substrate 10 is more suppressed. Accordingly, the protruded portion content ratio of the roughening surface 14 subjected to the etching processing is 80% or more, preferably 90% or more, and more preferably 95% or more.

(4) Characteristics

In the process for manufacturing a FPD, a semiconductor element such as a TFT, or more specifically, a multilayer thin film comprising a polysilicon thin film, an ITO thin film, and the like, is formed on the element forming surface 12 of the glass substrate 10. Each time the film forming processing is performed on the element forming surface 12, the glass substrate 10 is removed from a susceptor inside a reactor vessel of a semiconductor manufacturing apparatus. At this time, peeling electrification occurs between the metal surface of the susceptor on which the glass substrate 10 is mounted and the roughening surface 14 of the glass substrate 10. When static electricity accumulates in the glass substrate 10 due to the peeling electrification, the roughening surface 14 of the glass substrate 10 is likely to stick to the metal surface of the susceptor due to the static electricity.

Accordingly, when the glass substrate 10 is removed from the susceptor, excessive force is applied to the glass substrate 10, and thus the glass substrate 10 is sometimes broken. Moreover, the semiconductor element or the like formed on the element forming surface 12 of the glass substrate 10 is sometimes broken due to voltage generated by the accumulating static electricity caused by the peeling electrification. In addition, in a process for manufacturing a liquid crystal panel, if a TFT panel and a CF panel are stuck to each other and liquid crystal is injected between them in a state in which the static electricity has accumulated in the TFT panel or the CF panel, display irregularity sometimes occurs in the manufactured liquid crystal panel. Therefore, it is important to suppress the electrification of the glass substrate 10 in the process for manufacturing a FPD.

The glass substrate 10, which is manufactured with the method for manufacturing a glass substrate according to the present embodiment, has a roughening surface 14, which is roughened through the etching processing. In the etching processing, the surface processing is performed on the roughening surface 14 such that the roughening surface 14 has a protruded portion area ratio of 0.5% to 10% and a protruded portion content ratio of 80% or more, and preferably 90% or more.

Since the roughening surface 14 has a protruded portion area ratio of 0.5% to 10%, when the glass substrate 10 is mounted on the table, the glass substrate 10 is supported by the protruded portions formed on the roughening surface 14. Accordingly, the area of contact between the roughening surface 14 and the surface of the table becomes small, and the distance between the glass substrate 10 and the table is sufficiently maintained. Therefore, the electrification of the glass substrate 10 is effectively suppressed.

Moreover, since the roughening surface 14 has a protruded portion content ratio of 80% or more, the protruded portions formed on the roughening surface 14 are uniformly spread over the entire roughening surface 14. Accordingly, the imbalance in the distribution of the protruded portions on the roughening surface 14 is small, and the area of the region in which the surface of the table on which the glass substrate 10 is mounted is in contact with the roughening surface 14 of the glass substrate 10 is small. Therefore, the electrification of the glass substrate 10 is effectively suppressed.

Accordingly, in the method for manufacturing a glass substrate according to the present embodiment, the surface processing is performed on the roughening surface 14 such that the roughening surface 14 has a protruded portion area ratio of 0.5% to 10% and a protruded portion content ratio of 80% or more, thus effectively suppressing the peeling electrification of the glass substrate 10. In the process for manufacturing a FPD, this makes it possible to effectively suppress the breakage of the glass substrate 10 and the breakage of the semiconductor or the like formed on the surface of the glass substrate 10. Moreover, the attachment of particles on the surface of the glass substrate 10 due to the electrification of the glass substrate 10 is suppressed, thus making it possible to suppress the peeling of a color filter and the peeling of a wiring electrode due to the attachment of the particles. The particles are fine foreign matter such as dust or dirt, for example.

Moreover, the electrification of the glass substrate 10 is suppressed by performing the surface processing on the roughening surface 14, and therefore, the method for manufacturing a glass substrate according to the present embodiment can be preferably used for the glass substrate 10 on which the film forming processing and the like are performed using a semiconductor manufacturing apparatus, and in particular, for a glass substrate for forming a color filter for which it is desired that no foreign matter such as dust or dirt attaches to the glass substrate 10.

In addition, the method for manufacturing a glass substrate according to the present embodiment can be preferably used for a glass substrate obtained by forming a TFT including a gate insulating film having a film thickness of less than 100 nm on the element forming surface 12 of the glass substrate 10. In recent years, in a panel for a high-definition and high-resolution display, the film thickness of each layer such as mainly the gate insulating film included in a semiconductor element has been reduced. It is required to reduce the thickness of the gate insulating film in order to reduce a pixel pitch to quickly switch display. Moreover, from the viewpoint in which gate voltage may be reduced, the film thickness of the gate insulating film has been reduced in order to save the power for the panel for a display. As an example of such a reduction of the film thickness in the panel for a high-definition and high-resolution display, the film thickness of the gate insulating film is reduced to less than 100 nm. The gate insulating film conventionally has a film thickness of more than 100 nm, but, in recent years, panels in which the gate insulating film having a film thickness of less than 50 nm, and further less than 20 nm is used are also manufactured. Since the quality of the gate insulating film has been improved, it is possible to reduce the thickness of the gate insulating film in this manner. Moreover, panels are manufactured in which TFT wiring has a minimum line width of less than 4 μm. Panels having a circuit with a line width of 1 μm to 3 μm are manufactured, for example. However, there is a problem of electrostatic breakdown of the semiconductor element in that electricity is discharged in the gate insulating film due to the electrification of the glass substrate 10 and thus the gate insulating film is damaged, for example. Therefore, the glass substrate 10 manufactured with the method for manufacturing a glass substrate according to the present embodiment is useful as the glass substrate 10 used in the panel for a display provided with a TFT in which the gate insulating film has a film thickness of less than 100 nm and the minimum line width is less than 4 μm.

Moreover, the glass substrate 10 manufactured with the method for manufacturing a glass substrate according to the present embodiment has not only an effect of preventing the accumulation of static electricity but also an effect of preventing a stage used in a process for manufacturing a panel and the glass substrate from sticking to each other. When the roughening surface 14 of the glass substrate 10 is uniformly roughened, passages of air are uniformly formed between the roughening surface 14 and the surface of the stage. Accordingly, when the glass substrate 10 mounted on the stage is lifted up, the force is unlikely to be locally applied to the glass substrate 10, thus making it possible to suppress the breakage of the glass substrate 10.

In the present embodiment, both the element forming surface 12 and the roughening surface 14 are roughened by performing the immersion etching processing on the glass substrate 10. This makes it possible to effectively suppress not only the electrification of the roughening surface 14 but also the electrification of the element forming surface 12. Since a semiconductor element such as a TFT is formed on the element forming surface 12 of the glass substrate 10, it is preferable that the element forming surface 12 is roughened to the extent that the formation of the semiconductor element is not inhibited. Specifically, it is preferable that the roughened element forming surface 12 has an arithmetic mean roughness Ra of less than 1.5 nm, and preferably less than 1.0 nm.

(5) Variations

Although the method for manufacturing a glass substrate according to the present invention has been described above, the present invention is not limited to the above-mentioned embodiment, and various improvements and modifications may be made without departing from the gist of the present invention. The present invention is effective for not only a glass substrate with a semiconductor element formed on the surface thereof but also a glass substrate with a color filter formed on the surface thereof.

(5-1) Variation A

Although the roughening surface 14 of the glass substrate 10 is roughened through the immersion etching processing in this embodiment, cleaning processing may be performed on the roughening surface 14 before the immersion etching processing. The cleaning processing is atmospheric pressure plasma cleaning processing, for example. In the atmospheric pressure plasma cleaning processing, a gas activated in a plasma state that is generated from argon and air, which is a mixed gas of nitrogen and oxygen, for example, is used.

In the atmospheric pressure plasma cleaning processing, a thin film of an organic substance that attaches to the roughening surface 14 is removed by blowing the gas activated in a plasma state on the roughening surface 14 of the glass substrate 10. The thin film of an organic substance serves as a mask in the subsequent etching processing. Therefore, the cleaning processing may be performed before the etching processing so as to remove the thin film of an organic substance from the roughening surface 14 and thus prevent the thin film from serving as a mask.

The thin film of an organic substance is removed from the roughening surface 14 cleaned through the atmospheric pressure plasma cleaning processing, and the roughening surface 14 has a hydrophilic property. A contact angle of water with the roughening surface 14, which has been cleaned, is preferably 10° or less, and more preferably 5° or less. The contact angle of water may be adjusted by controlling a period of time to clean the roughening surface 14 or a flow rate of the gas blown on the roughening surface 14.

In the process for cleaning the roughening surface 14, the thin film of an organic substance may also be removed through performing ozone gas blowing processing and ultraviolet ray irradiation processing instead of the plasma cleaning processing. In the cleaning process, it is sufficient to at least remove the thin film of an organic substance by oxidizing or reforming the organic substance. The cleaning process performed before the surface processing in the etching process is not always essential, and need not be performed if the roughening surface 14 to be subjected to the surface processing is highly clean.

(5-2) Variation B

Although the immersion etching processing is performed as wet etching processing in this embodiment, roll etching treatment, shower etching treatment, or the like may also be performed. In the roll etching processing and the shower etching processing, compared with the immersion etching processing, liquid contact time that is a period of time when the roughening surface 14 is in contact with an etchant is shorter, and it is difficult to control the liquid contact time. Therefore, in the roll etching processing and the shower etching processing, it is preferable to increase the concentration of hydrogen fluoride contained in the etchant compared with the immersion etching processing, and to control the spread of the protruded portions formed on the roughening surface 14 by adjusting the concentration of hydrogen fluoride. In the case of performing the roll etching processing or the shower etching processing, the concentration of hydrogen fluoride contained in the etchant is preferably 2000 ppm to 8000 ppm.

Moreover, the cleaning processing may be performed on the glass substrate 10 before the wet etching processing is performed. Organic substances attaching to the surface of the glass substrate 10 are removed through the cleaning processing. The wet etching processing is less likely to be affected by organic substances compared with the dry etching processing. However, when the cleaning processing is performed before the wet etching processing, it is possible to control the spread of the protruded portions formed on the roughening surface 14 of the glass substrate 10, and to uniformly form the protruded portions over the entire roughening surface 14.

(5-3) Variation C

In this embodiment, both the element forming surface 12 and the roughening surface 14 of the glass substrate 10 are roughened through the immersion etching processing in which the entire glass substrate 10 is immersed in an etching liquid, but it is possible to roughen only the roughening surface 14. An example of the etching processing for roughening only the roughening surface 14 is chemical etching processing such as dry etching processing or wet etching processing. In the chemical etching processing, a fluorine-based etchant is used, and it is particularly preferable to use an etchant containing hydrogen fluoride.

Figure 7:
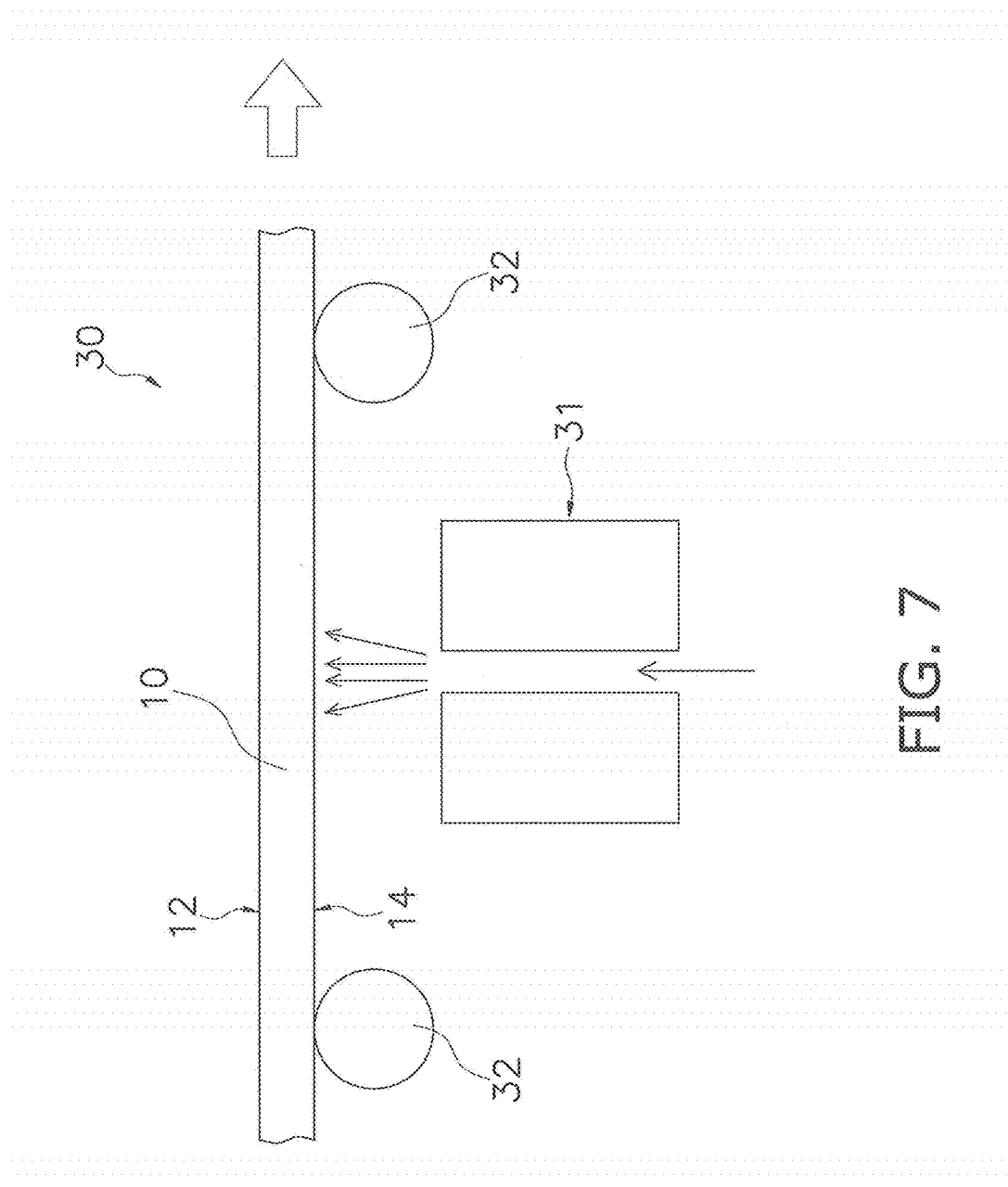
FIG. 7 is a diagram showing an example of a dry etching apparatus in Variation B.

FIG. 7 is a diagram showing an example of a dry etching apparatus. A dry etching apparatus 30 mainly comprises an etching nozzle 31 and conveying rollers 32. The glass substrate 10 is conveyed with the conveying rollers 32. The roughening surface 14 of the glass substrate 10 is a surface brought into contact with the conveying rollers 32. The etching nozzle 31 is a slit-shaped nozzle extending in the width direction of the glass substrate 10. The etching nozzle 31 sprays an etchant on the roughening surface 14 of the glass substrate 10, which is being conveyed. The etchant is hydrogen fluoride in gaseous form that is generated by passing a mixed gas of carbon tetrafluoride and water through a carrier gas in a plasma state, for example. Nitrogen, argon, or the like is used as the carrier gas.

Figure 8:
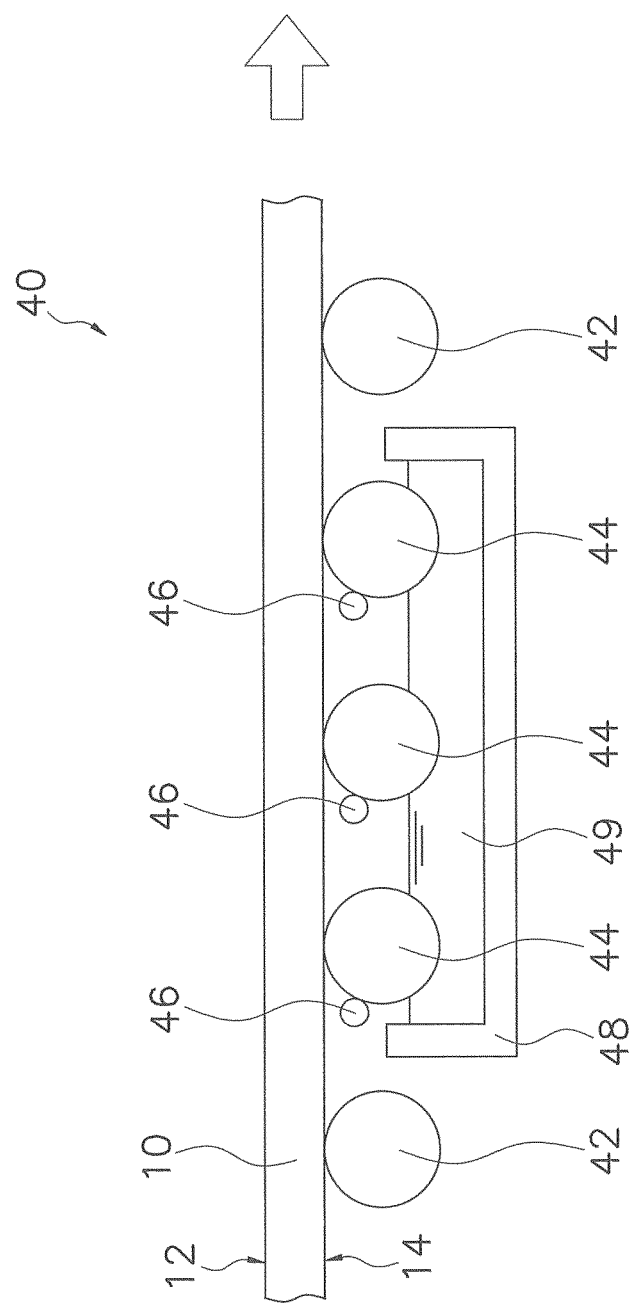
FIG. 8 is a diagram showing an example of a wet etching apparatus in Variation B.

FIG. 8 is a diagram showing an example of a wet etching apparatus. A wet etching apparatus 40 mainly comprises conveying rollers 42, roughening rollers 44, contact rollers 46, and an etchant tank 48. The glass substrate 10 is conveyed with the conveying rollers 42 and the roughening rollers 44. The roughening surface 14 of the glass substrate 10 is a surface that comes into contact with the conveying rollers 42 and the roughening rollers 44. The outer circumferential surface of each roughening roller 44 is constituted by a sponge. A portion of the outer circumferential surface of the roughening roller 44 is immersed in an etching liquid 49 stored in the etchant tank 48. The etching liquid 49 is hydrofluoric acid, for example. The surface of the roughening roller 44 absorbs the etching liquid 49. Therefore, the etching liquid 49 absorbed by the roughening rollers 44 comes into contact with the roughening surface 14 of the glass substrate 10, and thus is applied onto the roughening surface 14. A portion of the etching liquid 49 absorbed by the roughening rollers 44 is squeezed out by the contact rollers 46, which press against the surfaces of the roughening rollers 44, in order to adjust the amount of the etching liquid 49 applied onto the roughening surface 14. Moreover, when air or the like is blown on the element forming surface 12 of the glass substrate 10, it is possible to keep the pressure with which the roughening surface 14 of the glass substrate 10 comes into contact with the roughening rollers 44 high.

In the etching process, it is possible to adjust the time required for the etching processing and the amount of etchant attaching to the roughening surface 14 by adjusting the speed of conveying the glass substrate 10. Since the thin film of an organic substance is removed from the roughening surface 14 of the glass substrate 10 in the cleaning process before the etching process is performed, the roughening surface 14 is uniformly etched. When etching only the roughening surface 14, it is possible to form the element forming surface 12 into an extremely smooth surface having a Ra of 0.2 nm or less as a surface formed with a down draw method.

(5-4) Variation D

FIG. 8 illustrates roller etching processing in which an etching liquid is applied onto the roughening surface 14 using the roughening rollers 44 as an example of the wet etching processing performed on the roughening surface 14 of the glass substrate 10. However, shower etching processing may also be performed as the wet etching processing performed on the roughening surface 14, for example.

In the shower etching processing, fine liquid drops of the etching liquid are sprayed on the roughening surface 14 of the glass substrate 10. Accordingly, the etching liquid uniformly attaches to the roughening surface 14 to roughen the roughening surface 14.

EXAMPLES

As an Example of the method for manufacturing a glass substrate according to the present invention, a plurality of glass substrates were subjected to the surface processing of the wet etching processing under different conditions, and the protruded portion area ratio, the protruded portion content ratio, and the electrification characteristic of the roughening surfaces, which were the surfaces of the glass substrates subjected to the surface processing, were measured. The glass substrates used in the measurements had a size of 730 mm×920 mm and a thickness of 0.5 mm. The glass substrates used in the measurements were constituted by boroaluminosilicate glass having a composition including Si, Al and B. The glass substrates used in the measurements contained R'$_2$O (R' is at least one selected from Li, Na and K) in an amount of 0 mass % to 2.0 mass % as an alkaline component.

First, the roughening surface of the glass substrate was cleaned using an atmospheric pressure plasma cleaning apparatus. In the cleaning process, argon gas in a plasma state was blown on the roughening surface at a rate of a predetermined amount per minute to clean the surface of the glass substrate. Accordingly, organic substances attaching to the surface of the glass substrate were removed. The wet etching processing is less likely to be affected by organic substances compared with the dry etching processing. However, when the cleaning processing is performed before the wet etching processing, it is possible to control the spread of the protruded portions formed on the roughening surface of the glass substrate, and to uniformly form the protruded portions over the entire roughening surface.

Next, the cleaned roughening surface was subjected to the surface processing of the wet etching processing. In the wet etching processing, hydrofluoric acid immersion etching processing was performed as shown in FIG. 3.

Next, a 50 mm×50 mm square sample was cut out from the glass substrate having the roughening surface subjected to the surface processing, and was used to evaluate the glass substrate subjected to the etching processing. Specifically, the roughening surface of each cut-out sample was measured using an atomic force microscope (model XE-100 available from Park Systems) in a non-contact mode. Before the measurements, measurement conditions of the atomic force microscope were adjusted in order to measure the unevenness of a surface having a small surface roughness, e.g., an arithmetic mean roughness Ra of less than 1 nm. The scan area was set to 1 μm×1 μm (the sampling numbers were 256 points×256 points), the scan rate was set to 0.8 Hz, and the servo gain in the non-contact mode was set to 1.5. The set points were automatically set. With these measurements, the two-dimensional shape of the surface profile related to the unevenness formed on the roughening surface of the glass substrate was obtained. The protruded portion area ratio was determined by obtaining a histogram related to the unevenness of the roughening surface from the shape of the surface profile, slicing the histogram at positions that were 1 nm or more higher than an average reference line of the roughening surface, and counting the number of pixels located at positions that were 1 nm or more higher than the average reference line. Moreover, one hundred divided regions were set by equally dividing the scan area having a 1 μm×1 μm square shape into 10×10 regions. Then, the protruded portion content ratio was determined by counting the number of the divided regions having the protruded portion with reference to the shape of the surface profile.

Next, the electrification characteristic of the glass substrate was evaluated. The electrification characteristic was evaluated in a clean booth in which the temperature was controlled to be 25° C. and the humidity was controlled to be 60%.

Figure 9:
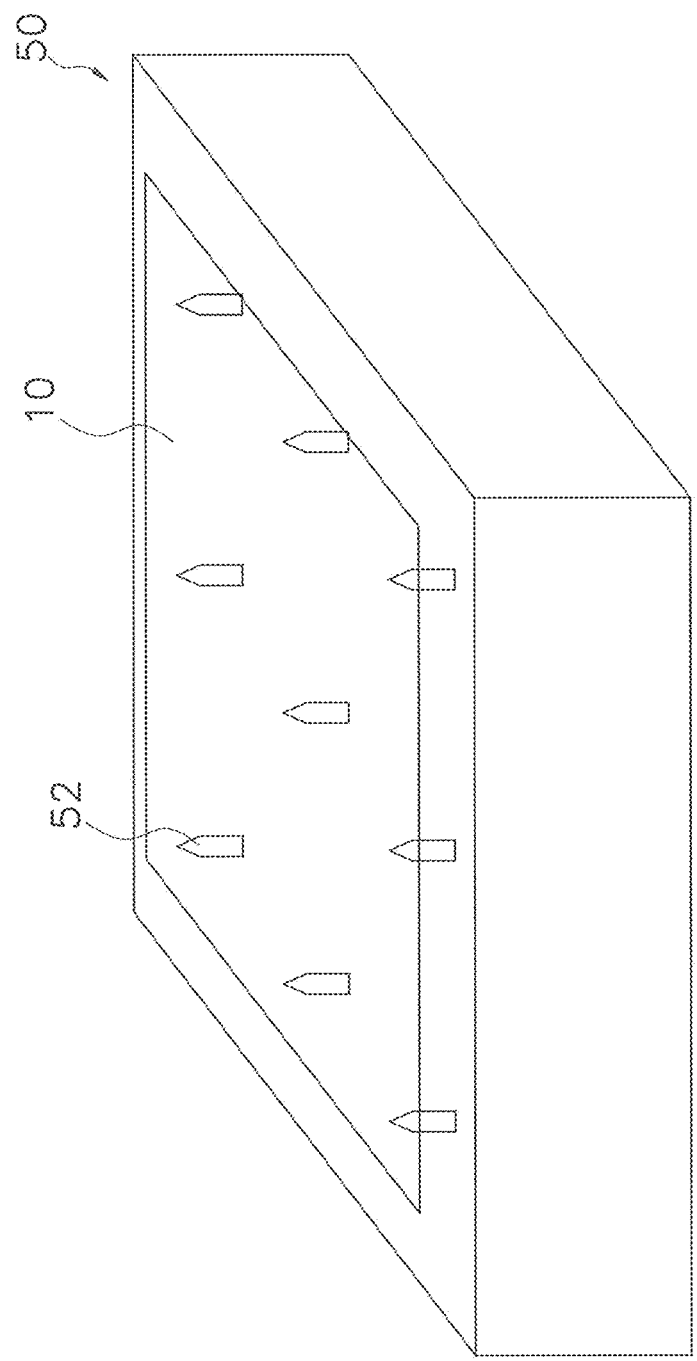
FIG. 9 is a schematic view of an apparatus for evaluating an electrification characteristic of the glass substrate in Examples.

FIG. 9 is a schematic view of an apparatus for evaluating the electrification characteristic of the glass substrate. First, the glass substrate 10 was mounted on a substrate table 50 and supported by up-and-down pins 52. Next, the glass substrate 10 was moved down and mounted on the substrate table 50 by moving down the up-and-down pins 52 with respect to the mounting surface of the substrate table 50. The substrate table 50 had an anodized surface obtained by anodizing the surface of an aluminum table. Next, the glass substrate 10 was sucked through a suction port provided in the mounting surface of the substrate table 50 using a suction apparatus (not shown). Then, the suction of the glass substrate 10 was finished, and the up-and-down pins 52 were moved up.

The above-described steps of moving down, sucking, finishing the suction of, and moving up the glass substrate were performed as one cycle, and this cycle was repeated 50 times in order to evaluate the electrification characteristic of the glass substrate. Thereafter, the electrification amount of the glass substrate was measured. The electrification amount was measured alternatively by measuring the electric potential of the surface of the glass at the central portion of the glass. The electrification amount was measured using a surface electrometer (ZJ-SD available from Omron Corporation). The surface electrometer was provided at a position that was 10 mm higher than the surface opposite to the roughening surface of the glass substrate. Moreover, the suction force of the suction port provided in the mounting surface of the substrate table was set to 0.6 MPa.

Table 1 below shows the surface processing methods, the surface processing conditions, the protruded portion area ratios, the protruded portion content ratios, and the evaluations of the electrification characteristics for six glass substrates of Examples 1 to 3 and Comparative Examples 1 to 3.

In Table 1, the "surface processing method" indicates an etching processing method performed on the roughening surface 14 of the glass substrate 10. In Examples 1 to 3, the wet etching processing using hydrofluoric acid was performed, and in Comparative Examples 1 to 3, polishing processing using a cerium oxide polishing agent was performed. In Table 1, the "surface processing condition" indicates the concentrations of hydrofluoric acid in the case of Examples 1 to 3, and the polishing times in the case of Comparative Examples 1 to 3. In Table 1, the "electrification characteristic" indicates the evaluations of the electrification amounts of the surfaces of the glass substrates, and is expressed as "Excellent", "Good", "Fair" or "Poor" in ascending order of the absolute values of the maximum electrification amounts of the surfaces of the glass substrates.

TABLE 1

|  | Surface processing method | Surface processing condition | Protruded portion area ratio | Protruded portion content ratio | Electrification characteristic |
| --- | --- | --- | --- | --- | --- |
| Work. Ex. 1 | Hydrofluoric acid immersion | 450 ppm | 1.27% | 92% | Good |
| Work. Ex. 2 | Hydrofluoric acid immersion | 600 ppm | 3.12% | 96% | Excellent |
| Work. Ex. 3 | Hydrofluoric acid immersion | 800 ppm | 7.25% | 100% | Excellent |
| Comp. Ex. 1 | Cerium oxide polishing | 20 minutes | 1.45% | 15% | Poor |
| Comp. Ex. 2 | Cerium oxide polishing | 10 minutes | 3.23% | 58% | Fair |
| Comp. Ex. 3 | Cerium oxide polishing | 5 minutes | 7.89% | 62% | Fair |

As shown in Table 1, all of Examples 1 to 3, which were subjected to the hydrofluoric acid immersion etching processing, had a protruded portion content ratio of 90% or more. On the other hand, Comparative Examples 1 to 3, which were subjected to the cerium oxide polishing processing, had a protruded portion area ratio similar to that in a case where the hydrofluoric acid immersion etching processing was performed, but had a protruded portion content ratio of 62% at most. That is, the protruded portion content ratios of the surfaces of the glass substrates subjected to the hydrofluoric acid immersion etching processing were larger than the protruded portion content ratios of the surfaces of the glass substrates subjected to the cerium oxide polishing processing.

Moreover, as shown in Table 1, the larger the protruded portion content ratio was, the more likely the electrification characteristic of the glass substrate was to be improved. That is, it was confirmed that the less the imbalance in the distribution of the protruded portion on the surface of the glass substrate was, the more the peeling electrification of the glass substrate was suppressed.

Figure 10:
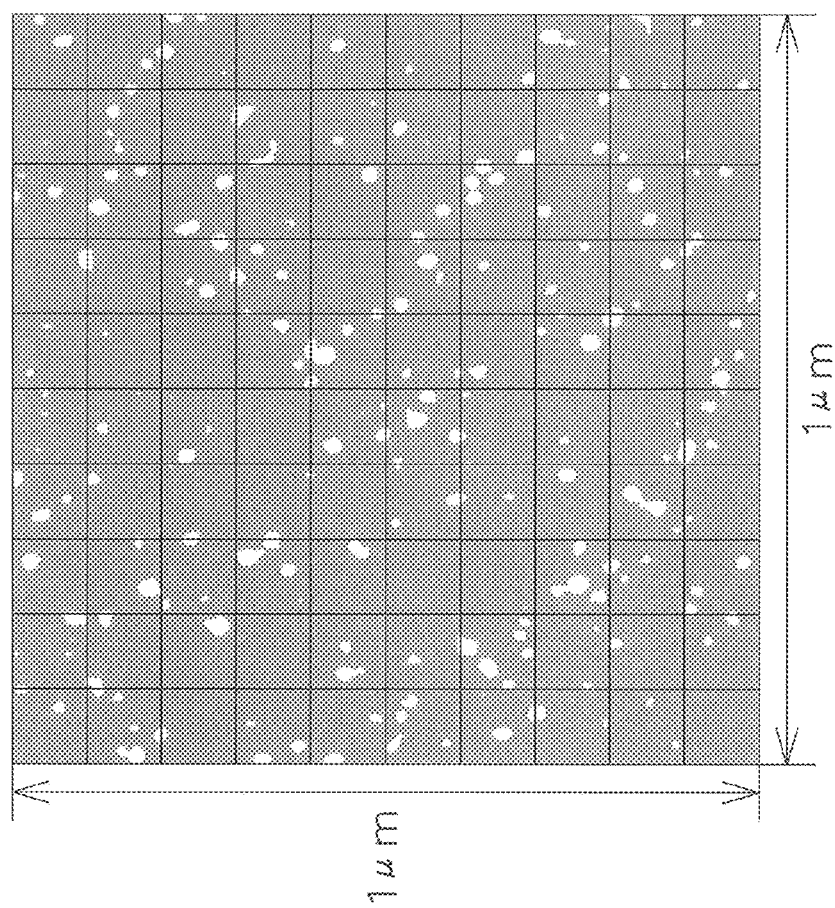
FIG. 10 is a diagram showing an example of the distribution of the protruded portions on the surface of a glass substrate subjected to hydrofluoric acid immersion etching processing in the Examples.
Figure 11:
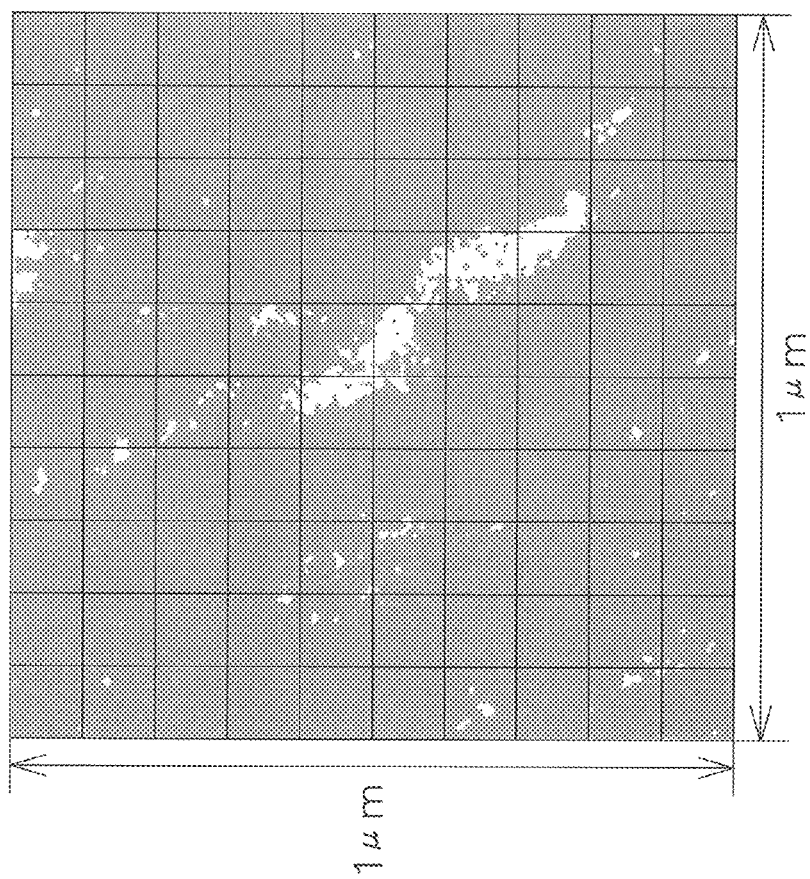
FIG. 11 is a diagram showing an example of the distribution of the protruded portions on the surface of a glass substrate subjected to cerium oxide-based polishing processing in the Examples.

FIG. 10 shows an example of the distribution of the protruded portions on the surface of the glass substrate subjected to the hydrofluoric acid immersion etching processing. FIG. 11 shows an example of the distribution of the protruded portions on the surface of the glass substrate subjected to the cerium oxide polishing processing. In FIGS. 10 and 11, the protruded portions are shown as white regions. In FIGS. 10 and 11, border lines between the adjacent divided regions are indicated by solid lines.

As shown in FIGS. 10 and 11, with the hydrofluoric acid immersion etching processing, the surface of the glass substrate was processed so that the protruded portions were uniformly distributed over the entire surface of the glass substrate. On the other hand, with the cerium oxide polishing processing, the surface of the glass substrate was processed so that the distribution of the protruded portions over the entire surface of the glass substrate became imbalanced. In FIG. 10, the surface of the glass substrate had a protruded portion area ratio of 3.12%, and a protruded portion content ratio of 96%. In FIG. 11, the surface of the glass substrate had a protruded portion area ratio of 3.23%, and a protruded portion content ratio of 58%.

LIST OF REFERENCE NUMERALS

10 Glass substrate
12 Element forming surface (Second main surface)
14 Roughening surface (First main surface)

CITATION LIST

Patent Literature

[PLT1]: JP 2005-255478A

The invention claimed is:
1. A method for manufacturing a glass substrate for a display, comprising:
   a manufacturing step of manufacturing a glass substrate; and
   a surface processing step of performing surface processing for forming unevenness on a glass surface that is one main surface of the glass substrate,
   wherein in the surface processing step, protruded portions having a height of 1 nm or more from an average line of a roughness curve are dispersedly provided on the glass surface,
   the surface processing is performed such that a protruded portion area ratio is 0.5 to 10%, the protruded portion area ratio being a ratio of an area of the protruded portions with respect to an area of any rectangular region that has a square shape with a side length of 1 μm and occupies a portion of the glass surface, and
   in a case where the rectangular region is equally divided into at least one hundred divided regions having a square shape, the surface processing is performed such that a protruded portion content ratio is 80% or more, the protruded portion content ratio being a ratio of the number of divided regions having the protruded portions with respect to the number of divided regions included in the rectangular region.
2. The method for manufacturing a glass substrate according to claim 1,
   wherein the protruded portion area ratio is 0.75% to 7.0%.

3. The method for manufacturing a glass substrate according to claim 1,
   wherein the protruded portion content ratio is 90% or more.

4. The method for manufacturing a glass substrate according to claim 1,
   wherein the surface processing is chemical etching processing.

5. The method for manufacturing a glass substrate according to claim 1,
   wherein the main surface on a side opposite to the glass surface is a device surface on which a semiconductor element is to be formed.

6. The method for manufacturing a glass substrate according to claim 5,
   wherein the device surface is a surface on which a low-temperature polysilicon semiconductor or an oxide semiconductor is to be formed.

7. The method for manufacturing a glass substrate according to claim 1,
   wherein the glass substrate is constituted by boroaluminosilicate glass having a composition including Si, Al and B.

* * * * *